(12) United States Patent
Yabe et al.

(10) Patent No.: US 6,556,484 B2
(45) Date of Patent: Apr. 29, 2003

(54) PLURAL LINE BUFFER TYPE MEMORY LSI

(75) Inventors: Yoshikazu Yabe, Tokyo (JP); Masato Motomura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/746,809

(22) Filed: Dec. 20, 2000

(65) Prior Publication Data

US 2002/0021591 A1 Feb. 21, 2002

(30) Foreign Application Priority Data

Dec. 20, 1999 (JP) ............................................ 11-360524

(51) Int. Cl.[7] ................................................ G11C 7/00
(52) U.S. Cl. ............................ 365/189.05; 365/230.03; 365/230.08
(58) Field of Search ....................... 365/230.03, 189.05, 365/233, 230.06, 230.08, 63

(56) References Cited

U.S. PATENT DOCUMENTS

| | | | | |
|---|---|---|---|---|
| 5,202,672 A | * | 4/1993 | Nakamura et al. | 340/747 |
| 5,724,353 A | * | 3/1998 | Sugawara | 370/395 |
| 5,801,776 A | * | 9/1998 | Tamura et al. | 348/403 |
| 5,896,347 A | * | 4/1999 | Tomita et al. | 365/233 |
| 5,973,746 A | * | 10/1999 | Nakamoto et al. | 348/458 |

FOREIGN PATENT DOCUMENTS

| | | | |
|---|---|---|---|
| JP | 62-14190 | 1/1987 | G09C/1/02 |
| JP | 5-274862 | 10/1993 | G11C/11/401 |
| JP | 7-134895 | 5/1995 | G11C/11/401 |

\* cited by examiner

*Primary Examiner*—David Nelms
*Assistant Examiner*—Gene N. Auduong
(74) *Attorney, Agent, or Firm*—Hayes Soloway P.C.

(57) ABSTRACT

In a plural line buffer type memory LSI, a line selection register 16 (holding an address for designating a line buffer) is added. The value of the line selection register 16 is previously updated by a memory access instruction having a room in an address. Thus, it is possible to maintain compatibility with input/output terminals of a general purpose memory LSI, or to prevent the increase in the number of input/output terminals, and also to prevent the increase of the memory access delay attributable to the restriction in connection with the issue of the commands. Accordingly, it is possible to maintain the compatibility with the general purpose memory LSI having no line buffer, or alternatively to prevent the increase of the memory access delay attributable to a restriction in an interval for issuing the commands.

14 Claims, 13 Drawing Sheets

| COMMAND | ADDRESS | | | | | | | | | | | | | |
|---------|----|----|----|----|---|---|---|---|---|---|---|---|---|---|
|         | 13 | 12 | 11 | 10 | 9 | 8 | 7 | 6 | 5 | 4 | 3 | 2 | 1 | 0 |
| APFC    | B  | R  | R  | R  | R | R | R | R | R | R | R | R | R | R |

B : BANK ADDRESS (1 bit)
R : ROW ADDRESS (13 bits)

| COMMAND | ADDRESS | | | | | | | | | | | | | |
|---------|----|----|----|----|---|---|---|---|---|---|---|---|---|---|
|         | 13 | 12 | 11 | 10 | 9 | 8 | 7 | 6 | 5 | 4 | 3 | 2 | 1 | 0 |
| ARST    | B  | R  | R  | R  | R | R | R | R | R | R | R | R | R | R |

B : BANK ADDRESS (1 bit)
R : ROW ADDRESS (13 bits)

| COMMAND | ADDRESS | | | | | | | | | | | | | |
|---------|----|----|----|----|---|---|---|---|---|---|---|---|---|---|
|         | 13 | 12 | 11 | 10 | 9 | 8 | 7 | 6 | 5 | 4 | 3 | 2 | 1 | 0 |
| READT   | ×  | ×  | ×  | ×  | × | C | C | C | C | C | C | C | C | C |

C : COLUMN ADDRESS (9 bits)
× : INDEFINITE

Fig. 10

| COMMAND | ADDRESS | | | | | | | | | | | | | |
|---|---|---|---|---|---|---|---|---|---|---|---|---|---|---|
| | 13 | 12 | 11 | 10 | 9 | 8 | 7 | 6 | 5 | 4 | 3 | 2 | 1 | 0 |
| WRITT | × | × | × | × | × | C | C | C | C | C | C | C | C | C |

C : COLUMN ADDRESS (9 bits)
× : INDEFINITE

Fig. 12

| COMMAND | ADDRESS | | | | | | | | | | | | | |
|---|---|---|---|---|---|---|---|---|---|---|---|---|---|---|
| | 13 | 12 | 11 | 10 | 9 | 8 | 7 | 6 | 5 | 4 | 3 | 2 | 1 | 0 |
| ACT | B | R | R | R | R | R | R | R | R | R | R | R | R | R |
| PFR | B | × | × | × | × | C | C | C | C | C | C | C | C | C |

B : BANK ADDRESS (1 bit)   C : COLUMN ADDRESS (9 bits)
R : ROW ADDRESS (13 bits)   × : INDEFINITE

Fig. 14

| COMMAND | ADDRESS | | | | | | | | | | | | | |
|---|---|---|---|---|---|---|---|---|---|---|---|---|---|---|
| | 13 | 12 | 11 | 10 | 9 | 8 | 7 | 6 | 5 | 4 | 3 | 2 | 1 | 0 |
| ACT | B | R | R | R | R | R | R | R | R | R | R | R | R | R |
| PFW | B | × | × | × | × | C | C | C | C | C | C | C | C | C |

B : BANK ADDRESS (1 bit)   C : COLUMN ADDRESS (9 bits)
R : ROW ADDRESS (13 bits)   × : INDEFINITE

Fig. 16

| COMMAND | ADDRESS | | | | | | | | | | | | | |
|---|---|---|---|---|---|---|---|---|---|---|---|---|---|---|
| | 13 | 12 | 11 | 10 | 9 | 8 | 7 | 6 | 5 | 4 | 3 | 2 | 1 | 0 |
| STCR | × | × | × | × | × | × | × | × | Cr | Cr | Ch | Ch | Ch | Ch |

Cr : LINE SELECTION REGISTER NO. (2bits)
Ch : LINE BUFFER NO. (4bits)
× : INDEFINITE

Fig. 18

| COMMAND | ADDRESS | | | | | | | | | | | | | |
|---|---|---|---|---|---|---|---|---|---|---|---|---|---|---|
| | 13 | 12 | 11 | 10 | 9 | 8 | 7 | 6 | 5 | 4 | 3 | 2 | 1 | 0 |
| READT | × | Ch | Ch | Ch | Ch | C | C | C | C | C | C | C | C | C |

C : COLUMN ADDRESS (9 bits)
Ch : LINE BUFFER NO. (4bits)
× : INDEFINITE

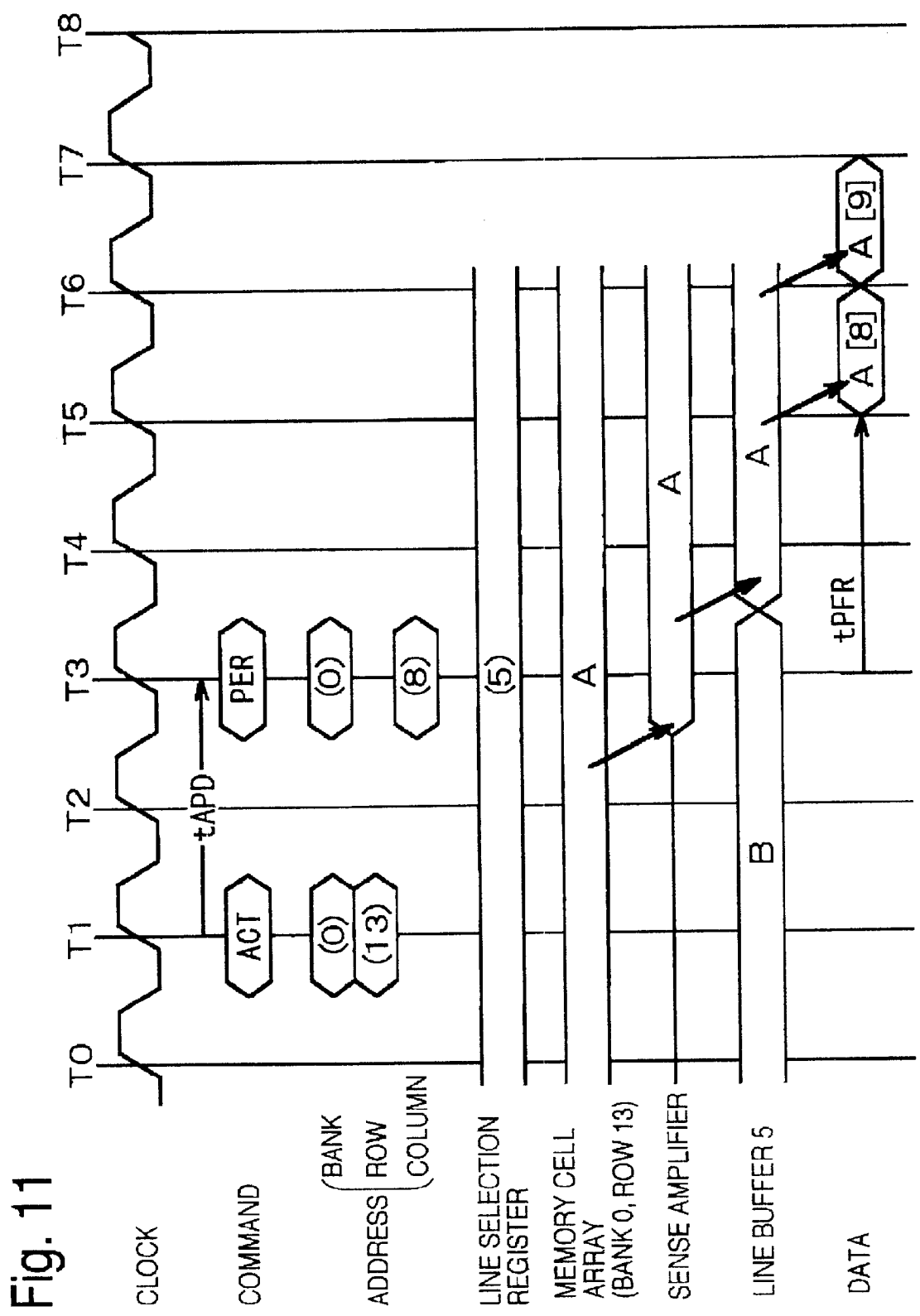

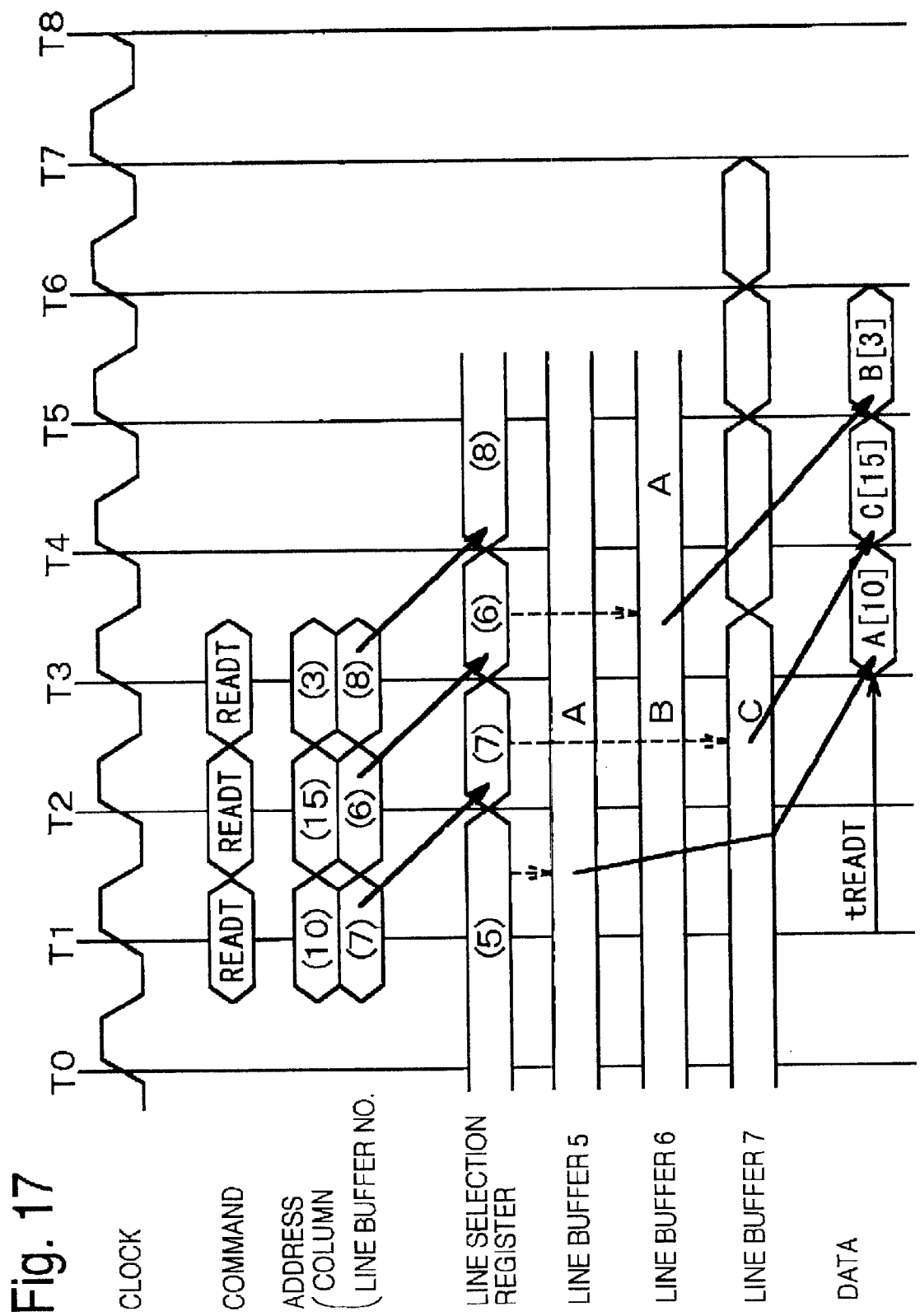

PLURAL LINE BUFFER TYPE MEMORY LSI

BACKGROUND OF THE INVENTION

The present invention relates to a plural line buffer type memory LSI, and more specifically to a plural line buffer type memory LSI including a plurality of line buffers added to a memory section so as to be able to effectively reduce a memory access delay.

As a technology for elevating the performance of a memory LSI, attention has been focused on a plural line buffer type memory LSI. This plural line buffer type memory LSI is so configured that a plural line buffer section composed of a plurality of line buffers is provided adjacent to a memory section within a memory LSI, and a portion of data stored in the * memory section is prefetched in the plural line buffer section (data is previously read out). This plural line buffer type memory LSI is required to effectively reduce a delay time in a memory access, in order to realize a high speed access.

As a typical example of the above mentioned plural line buffer type memory LSI, a Virtual Channel Memory (VCM) architecture reported by NEC Corporation is already known. This VCM architecture is actually incorporated in a commercially available 128M-bit DRAM, and is disclosed in a 128M-bit Virtual Channel SDRAM Data Sheet available from NEC Corporation. FIG. 19 briefly illustrates a circuit block of the 128M-bit VC-SDRAM. This 128M-bit VC-SDRAM will be called a "Prior Art" 1 in this specification. In this Prior Art 1, a line buffer is called a channel. As well known, a memory section 107 in the DRAM is activated in units of page, and the activated page is read out to a sense amplifier part 112 within the memory section 107. In the case of a conventional DRAM (called a "page type" memory LSI" hereinafter), data is read out in units of word, from the activated page (read out to the sense amplifier part). (The page type memory LSI is exemplified by SDRAM, and its detail is disclosed in a 128M-bit SDRAM Data Sheet available from NEC Corporation.) Differently from this SDRAM, the VC-SDRAM of the Prior Art 1 is characterized in that data of a portion called a segment, in the activated page, is read and written at a time between the memory section and a plural line buffer section 108. In the Prior Art 1, here, the size of the page, the segment and the word are 8 kbits, 2 kbits and 16 bits, respectively, and the number of the line buffers is 16. FIG. 20 shows a truth table of commands used in the Prior Art 1. Here, a bank address, a row address, a segment address (indicating a segment within a page), a column address, and a line buffer number are 1 bit, 14 bits, 2 bits, 9 bits and 4 bits, respectively.

As shown in detail in FIGS. 19 and 20, the memory access in the Prior Art 1 is realized by two steps of a background operation and a foreground operation. The background operation is a processing required for a data transfer in units of segment, performed between the memory section 107 and the plural line buffer section 108. The foreground operation is a data transfer processing in units of word, performed between the plural line buffer section 108 and a data input/output terminal group of a data buffer. The background operation mainly includes four kinds of operation, which are a page open operation for activating a page to read out data to the sense amplifier part 112 (ACT instruction), a prefetch operation for reading a desired segment from the (activated) page read to the sense amplifier part 112 in tie memory section 107, to the plural line buffer section 108 (PFC instruction), a restore operation for writing back a segment into the (activated) page in tie memory section 107 read to the sense amplifier part 112 (RST instruction), and a page close operation for closing the activated page to be ready to activate another page (PRE instruction). On the other hand, the foreground operation mainly includes two kinds of operation, which are a buffer read operation for reading a word from a desired line buffer 115 within the plural line buffer section 108 (READ instruction) and a buffer write operation for writing a word into a desired line buffer 115 (WRITE instruction). In the Prior Art 1, incidentally, the plural line buffer section 108 are constituted to be full-associative. This means that it is possible to read out a segment at an arbitrary position to an arbitrary line buffer 115.

In the plural line buffer type memory LSI, since it is necessary to designate the line buffer 115, it is necessary to increase the number of input/output terminals or alternatively to use a plurality of commends, in comparison with the page type memory LSI which uses no line buffer 115. In order to ensure compatibility with input/output terminals of the page type memory LSI, the Prior Art 1 is so configured to designate the line buffer by use of the latter means. FIG. 21 illustrates a procedure for reading out the data from the memory section 107 to the data input/output terminals in the Prior Art 1. This procedure is carried out by the following three operations: (1) First, a page is designated by a bank address and a row address, and the designated page is activated and held by the sense amplifier part (ACT instruction). (2) Next, a segment is designated from the page held in the sense amplifier part, by the bank address and the row address, and the designated segment is written into the line buffer 115 designated by the line buffer number (PFC instruction). (3) Finally, the line buffer is designated by the line buffer number, and a word designated by a column address is read out from the designated line buffer (READ instruction).

In the page type memory LSI which uses no line buffer 115, since it is unnecessary to designate the line buffer, the PFC instruction is not necessary. Therefore, the plural line buffer type memory LSI has an increased delay time in a memory access in comparison with the page type memory LSI, since the commands have increased, in the case that there is a restriction in an interval for issuing the commands. In addition, as shown in FIG. 21, the Prior Art 1 is required to decode again the bank address already decoded by the ACT instruction when the PFC instruction is received, and similarly to decode again the line buffer address already decoded by the PFC instruction when the READ instruction is received. In the Prior Art 1, therefore, a reduplicate operation is necessary, so that the delay time in the memory access becomes large.

Therefore, the plural line buffer type memory LSI is desired to reduce the delay time in the memory access attributable to the restriction in connection with the issue of the commands, while maintaining the compatibility with the input/output terminals of the page type memory LSI and suppressing the increase in the number of input/output terminals.

BRIEF SUMMARY OF THE INVENTION

Accordingly, it is an object of the present invention to provide a plural line buffer type memory LSI capable of reducing the delay time in the memory access attributable to the restriction in connection with the issue of the commands.

Another object of the present invention is to provide a plural line buffer type memory LSI capable of reducing the delay time in the memory access attributable to the restriction in connection with the issue of the commands, while maintaining the compatibility in input/output terminals or suppressing the increase in the number of input/output terminals.

The means for achieving the above objects can be defined as follows. Technical matters described in the following are suffixed with parenthesized reference numbers and signs. Those reference numbers and signs correspond to the reference numbers or signs given, to technical matters in at least one embodiment or a plurality of examples of a plurality of embodiments or examples of the present invention, in particular, technical matters shown in a drawing showing that embodiment or example. Those reference numbers and signs are given to clarify the correspondence between the technical matters defined in the claims and the technical matters of the embodiments and/or examples. However, this correspondence does not mean that the technical matters defined in the claims are interpreted to be limited to the technical matters of the embodiments and/or examples.

The plural line buffer type memory LSI in accordance with the present invention comprises a memory section (7), a plural line buffer section (8) having a plurality of line buffers (15) connected to the memory section (7), and a data buffer (9) connected to the plural line buffer section so that a data transfer is carried out between the memory section (7) and the plural line buffer section (8) and between the plural line buffer section (8) and the data buffer (9), and further includes a line selection register (16) for designating at least one line buffer (15) in the plural line buffer section (8). With addition of the line selection register (16), it is possible to reduce the delay in the memory access attributable to the restriction in connection with the issue of the commands.

As the result of the addition of the line selection register (16), the data transfer is carried out between the memory section (7) and the line buffer (15) designated by the line selection register (16). Furthermore, there is provided a data input/output terminal group connected to the data buffer (9), so that the data transfer is carried out between the line buffer (15) designated by the line selection register (16) and the data input/output terminal group (3).

When data is read out from a pre-activated memory section (7) to the data input/output terminal group (3), the data is written into the line buffer(s) (15) designated by the line selection register (16). Furthermore, a command input terminal group (2) and an address input terminal group (1) are provided, through which a bank address (designating one of a plurality of memory sections) and a row address (designating a page within a memory section) are supplied to the memory section (7), and an operation instruction is given for writing a page or a part of the page in the memory section (7) designated by the bank address and the row address, to the line buffer (15) designated by the line selection register (16). This operation instruction is given to an control circuit (6). Thus, it is possible to prevent an increase of the number of address input terminals, and to maintain compatibility with a general purpose memory LSI.

Through the command input terminal group (2) and the address input terminal group (1), the bank address and the row address are supplied to the memory section (7), and an operation instruction is given for writing data in the line buffer (15) designated by the line selection register (16), to a page or a part of the page in the memory section (7) designated by the bank address and the row address.

Through the command input terminal group (2) and the address input terminal group (1), a column address (designating a word in the line buffer) is inputted, and an operation instruction is given for outputting a word designated by the column address, in the data held in the line buffer (15) designated by and the line selection register (16), to the data input/output terminal group (3). Furthermore, through the command input terminal group (2) and the address input terminal group (1), a column address is inputted, and an operation instruction is given for writing data inputted through the data input/output terminal group (3), to a word designated by the column address, in the line buffer (15) designated by the line selection register (16). In addition, through the command input terminal group (2) and the address input terminal group (1), a bank address and a column address are inputted, and there are given an operation instruction for writing a page or a part of the page in the memory section (7) designated and pre-activated by the bank address, to the line buffer (15) designated by the line selection register (16), and another operation instruction for outputting a word designated by the column address, in the data held in the line buffer (15) designated by the line selection register (16), to the data input/output terminal group (3).

Through the command input terminal group (2) and the address input terminal group (1), a bank address and a column address are inputted, and there are given an operation instruction for writing a page or a part of the page in the memory section (7) designated and pre-activated by the bank address, to the line buffer (15) designated by the line selection register (16), and another operation instruction for writing the data inputted through the data input/output terminal group (3), into a word designated by the column address, to a word designated by the column address, in the line buffer (15) designated by the line selection register (16).

It is preferred that after completion of the operation of the instruction given as mentioned above, but prior to a next memory access operation, a pre-charging of the memory section (7) is automatically executed.

Furthermore, a plurality of line selection registers (16) are preferably provided. A portion of the address or the command for the memory access instruction is added with the number for designating one of the plurality of line selection registers (16), so that by using the line buffer (15) designated by the line selection register (16) designated by the added number, a data transfer is carried out between the memory section (7) and the plural line buffer section (8) and between the plural line buffer section (8) and the data input/output terminal group (3).

By using a portion of the address or the command for the memory access instruction, the line selection register (16) is designated, and the value written to the designated line selection register (16) is designated. After the memory access instruction is executed, the line selection register (16) is updated.

Furthermore, a control circuit (6) is added This control circuit (6) gives an operation instruction for designating one of the line selection registers (16) and changing the value of the designated line selection register.

BRIEF DESCRIPTION OF THE DRAWINGS

FIG. 10 is an address table showing a further address in the above mentioned operation mode;

FIG. 11 is a ting chart illustrating a still further mode of the operation of the plural line buffer type memory LSI in accordance with the present invention;

FIG. 12 is an address table showing a still further address in the above mentioned operation mode;

FIG. 14 is an address table showing a still further address in the above mentioned operation mode;

FIG. 16 is an address table showing a still further address in the above mentioned operation mode;

FIG. 17 is a timing chart illustrating a still further mode of the operation of the plural line buffer type memory LSI in accordance with the present invention;

FIG. 18 is an address table showing a still further address in the above mentioned operation mode;

DETAILED DESCRIPTION OF THE INVENTION

Figure 1:
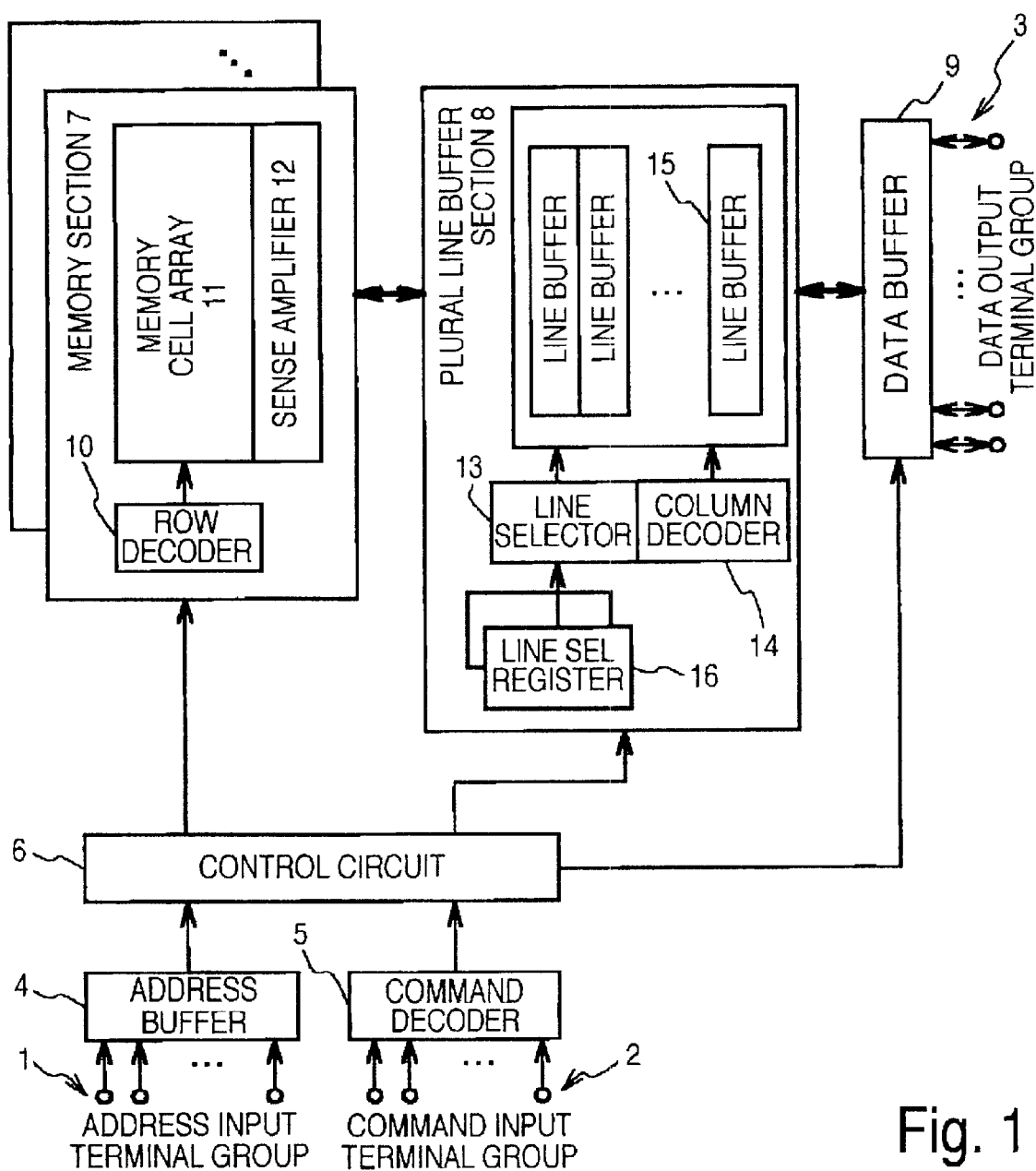
FIG. 1 is a circuit block diagram illustrating the plural line buffer type memory LSI in accordance with the present invention.

As shown in the drawings, an embodiment of the plural line buffer type memory LSI in accordance with the present invention is provided with memory sections and a plural line buffer section. As shown in FIG. 1, the memory sections 7 are bidirectionally connected to the plural line buffer section 8. A control circuit 6 is connected to the memory sections 7 and the plural line buffer section 8. An address buffer 4 and a command decoder 5 are connected to the control circuit 6.

As external terminals, an address input terminal group 1, a command input terminal group 2 and a data input/output terminal group 3 are provided. Through the address input terminal group 1, an address is inputted to the address buffer 4. Through the command input terminal group 2, a command is inputted to the command decoder 5. Through the data input/output terminal group 3, data is inputted to a data buffer 9. The data buffer 9 is bidirectionally connected to the plural line buffer section 8. The control circuit 6 is connected to the data buffer 9.

The memory section 7 includes a memory cell array 11, a sense amplifier part 12, and a row decoder 10. The row decoder 10 is connected to the memory cell armay 11. The plural line buffer section 8 includes line buffers 15, a line selector 13, a column decoder 14, and line selector registers 16.

The command inputted to the command input terminal group 2 is decoded by the command decoder 5, and then, is inputted to the control circuit 6. The address inputted to the address input terminal group 1 is latched in the address buffer 4, and then, is inputted to the control circuit 6. On the basis of the inputs supplied from the command decoder 5 and the address buffer 4, the control circuit 6 controls the memory sections 7, the plural line buffer section 8 and the data buffer 9. The memory cell array 11 is divided in units of page (which is a unit of data transfer between the memory cell array 11 and the sense amplifier part 12), and the row decoder 10 selects a page in the memory cell array 11, and the sense amplifier part 12 activates (amplifies) and holds the selected page.

The memory section 7 writes and reads the selected page or a portion of the selected page for at least one line buffer 15 in the plural line buffer section 8. The line selection register 16 holds the line buffer number for selecting the line buffer 15 used for the memory access operation. The line buffer number thus held is updated by the control circuit 6 on the basis of the input signals supplied through the command input terminal group 1 and the address input terminal group 2. The line selector 13 selects the line buffer 15 on the basis of the line buffer number held in the line selection register 16.

The line buffer 15 thus selected is used for a data transfer between the plural line buffer section 8 and the memory section 7. Each line buffer 15 is divided into words (each of which is a unit of data transfer between the plural line buffer section 8 and the data buffer 9). The column decoder 14 selects a word in the line buffer 15. The word in the line buffer 15 selected by the line selection register 16 and the column decoder 14, is outputted through the data buffer 9 to the data input/output terminal group 3, or alternatively, written with a data word which is supplied through the data input/output terminal group 3.

Figures 2, 4, 6, 8:
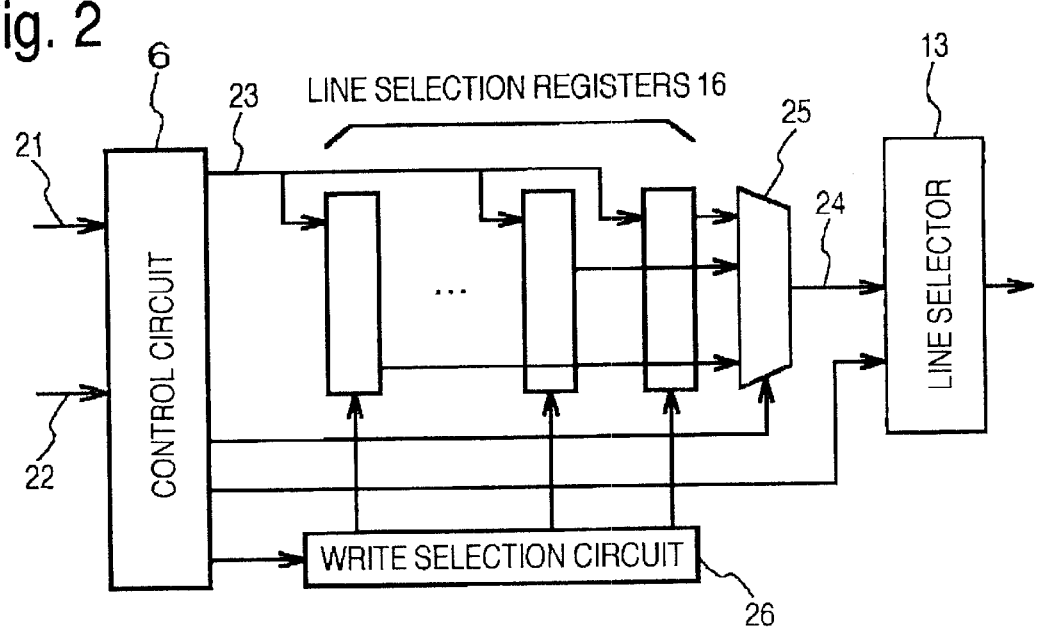
FIG. 2 is a circuit block diagram illustrating a line selection register in the plural line buffer type memory LSI in accordance with the present invention.
FIG. 4 is an address table showing an address in the above mentioned operation mode.
FIG. 6 is an address table showing an address in the above mentioned operation mode.
FIG. 8 is an address table showing another address in the above mentioned operation mode.

FIG. 2 shows a detail of a connection of the line selection registers 16. The address and the command are supplied through the address buffer 4 and the command decoder 5 to the control circuit 6. The control circuit 6 controls a read register selection circuit 25 and a write register selection circuit 26 in accordance with the address and the command. When the value in the line selection register 16 is read out, the read register selection circuit 25 outputs the line buffer number held in the line selection register 16 designated by the control circuit 6, to the line selector 13.

When the value of the line selection register 16 is updated, the control circuit 6 transmits a new line buffer number to each line selection register 16 through an update line buffer number line 23, and also transmits a signal for designating the line selection register 16 to be updated, to the write register selection circuit 26. The write register selection circuit 26 updates the value of the line selection register 16 designated in accordance to the input supplied from the control circuit 6.

Figure 3:
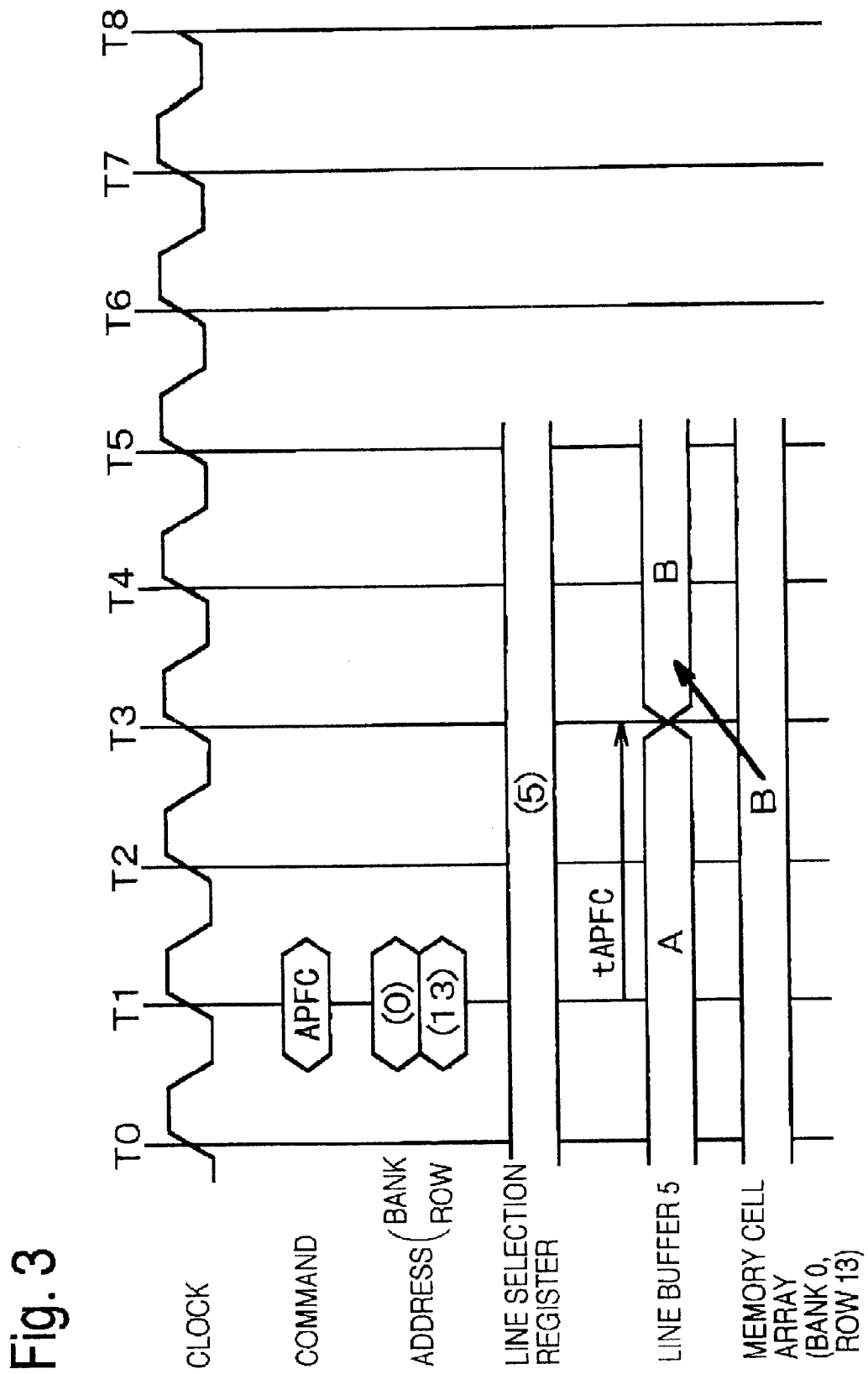
FIG. 3 is a timing chart illustrating one mode of an operation of the plural line buffer type memory LSI in accordance with the present invention.

FIG. 3 and FIG. 4 show a timing chart illustrating an operation of the plural line buffer type memory LSI in accordance with the present invention and an address allocation in the address input terminal group 1, respectively. A data transfer for transferring the data from the memory section 7 to the plural line buffer section 8 is shown (in the following, a command for executing this operation will be called an "APFC"). Here, a bank address (an address for selecting data included in one of the memory sections 7) and a row address are composed of 1 bit and 13 bits, respectively, and the address input terminal group is composed of 14 bits.

As shown in FIG. 3, at a time T1, the APFC instruction is inputted together with the bank address and the row address. The page designated by the bank address and the row address is activated and held by the sense amplifier part 12 in the memory section 7. Then, the page or a portion of the page, held in the sense amplifier part 12, is outputted to be supplied to the plural line buffer section 8. In the plural line buffer section 8, after a fixed delay time (tAPFC) from the time T1, the page or the portion of the page, outputted from the memory section 7, is written to the line buffer 15 selected in accordance with the line buffer number held in the line selection register 16 at the time T1.

As shown in FIG. 4, the address inputted to the address input terminal group 1 does not need the line buffer number for selecting the line buffer 15. Therefore, it is possible to prevent the increase in the number of address input terminals, thereby to maintain the compatibility with the general purpose LSI.

Figure 5:
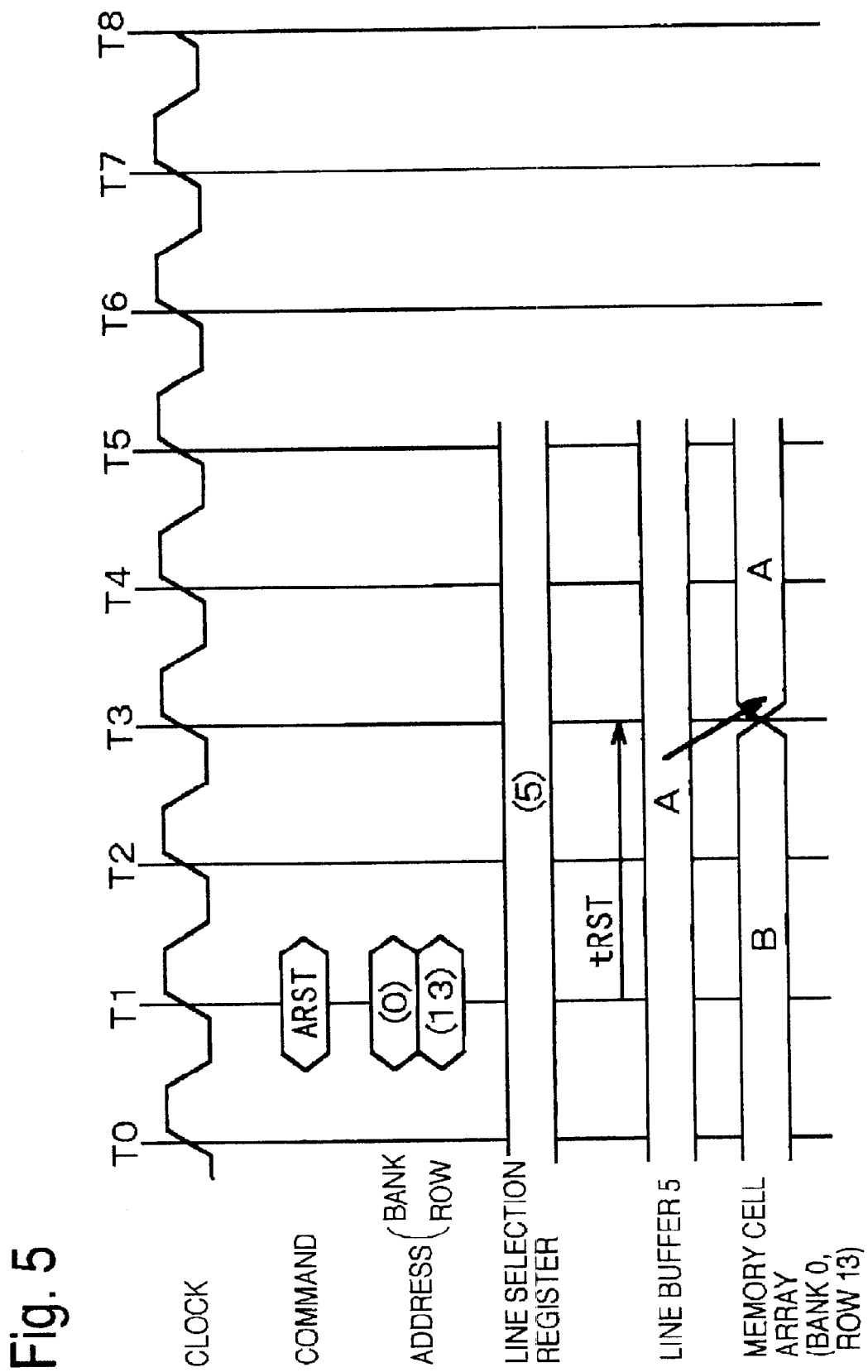
FIG. 5 is a timing chart illustrating another mode of the operation of the plural line buffer type memory LSI in accordance with the present invention.

FIG. 5 and FIG. 6 show a timing chart illustrating another mode of the operation of the plural line buffer type memory LSI in accordance with the present invention and another address allocation in the address input terminal group 1, respectively. A data transfer for transferring the data from the plural line buffer section 8 to the memory section 7 is shown (in the following, a command for executing this operation will be called an "ARST"). Here, the bank address and the row address are composed of 1 bit and 13 bits, respectively, and the address input terminal group 1 is composed of 14 bits. As shown in FIG. 5, at a time T1, the ARST instruction is inputted together with the bank address and the row address.

In the plural line buffer section 8, the data of the line buffer 15 selected by the line buffer number held in the line selection register 16 at the time T1 is outputted to the memory section 7. In the memory section 7, on the other hand, the page designated by the bank address and the row address is activated and held by the sense amplifier part 12. The data supplied from the plural line buffer section 8 is written to the page or a portion of the page designated by the bank address and the row address, after a fixed delay time (tARST) from the time T1.

As shown in FIG. 6, the address inputted to the address input terminal group 1 does not need tie line buffer number for selecting the line buffer 15. Therefore, it is possible to prevent the increase in the number of address input terminals, thereby to maintain the compatibility with the general purpose LSI.

Figure 7:
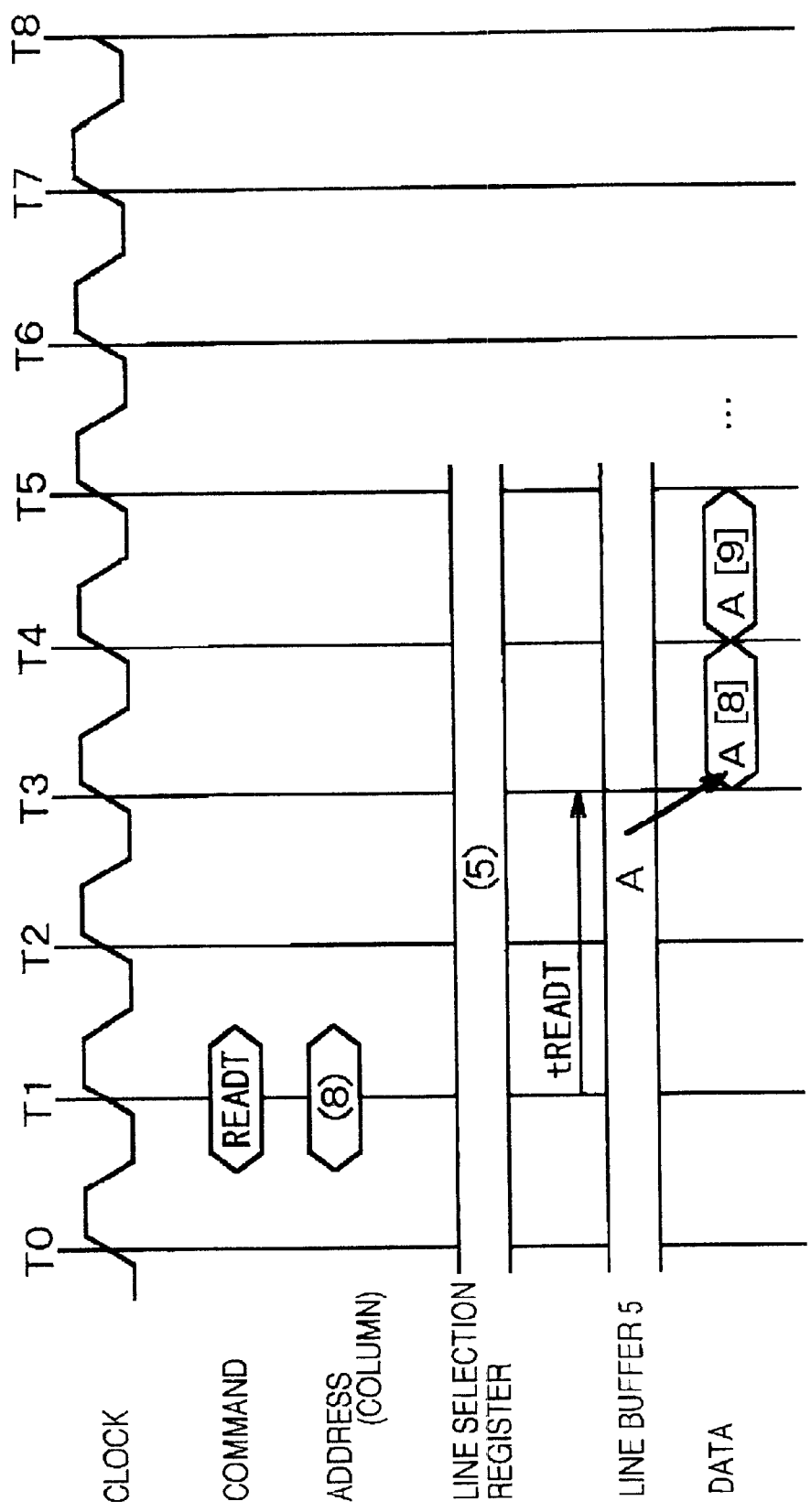
FIG. 7 is a timing chart illustrating still another mode of the operation of the plural line buffer type memory LSI in accordance with the present invention.

FIG. 7 and FIG. 8 show a timing chart illustrating still another mode of the operation of the plural line buffer type memory LSI in accordance with the present invention and still another address allocation in the address input terminal group 1, respectively. Here, a data transfer for transferring the data from the plural line buffer section 8 to the data input/output terminal group 3 is shown (in the following, a command for executing this operation will be called an "READ"). A column address is composed of 9 bits, and the address input terminal group 1 is composed of 14 bits.

As shown in FIG. 7, at a time T1, the READ instruction is inputted together with the column address. In the plural line buffer section 8, the data or a portion of the data, of the line buffer 15 selected by the line buffer number held in the line selection register 16 at the time T1 is outputted to the data buffer 9. The data buffer 9 outputs the word designated by the column address, to the data input/output terminal group 3, after a fixed delay time (tREAD) from the time T1.

As shown in FIG. 8, the address inputted to the address input terminal group 1 does not need the line buffer number for selecting the line buffer 15. Therefore, it is possible to prevent the increase in the number of address input terminals, thereby to maintain the compatibility with the general purpose LSI.

Figure 9:
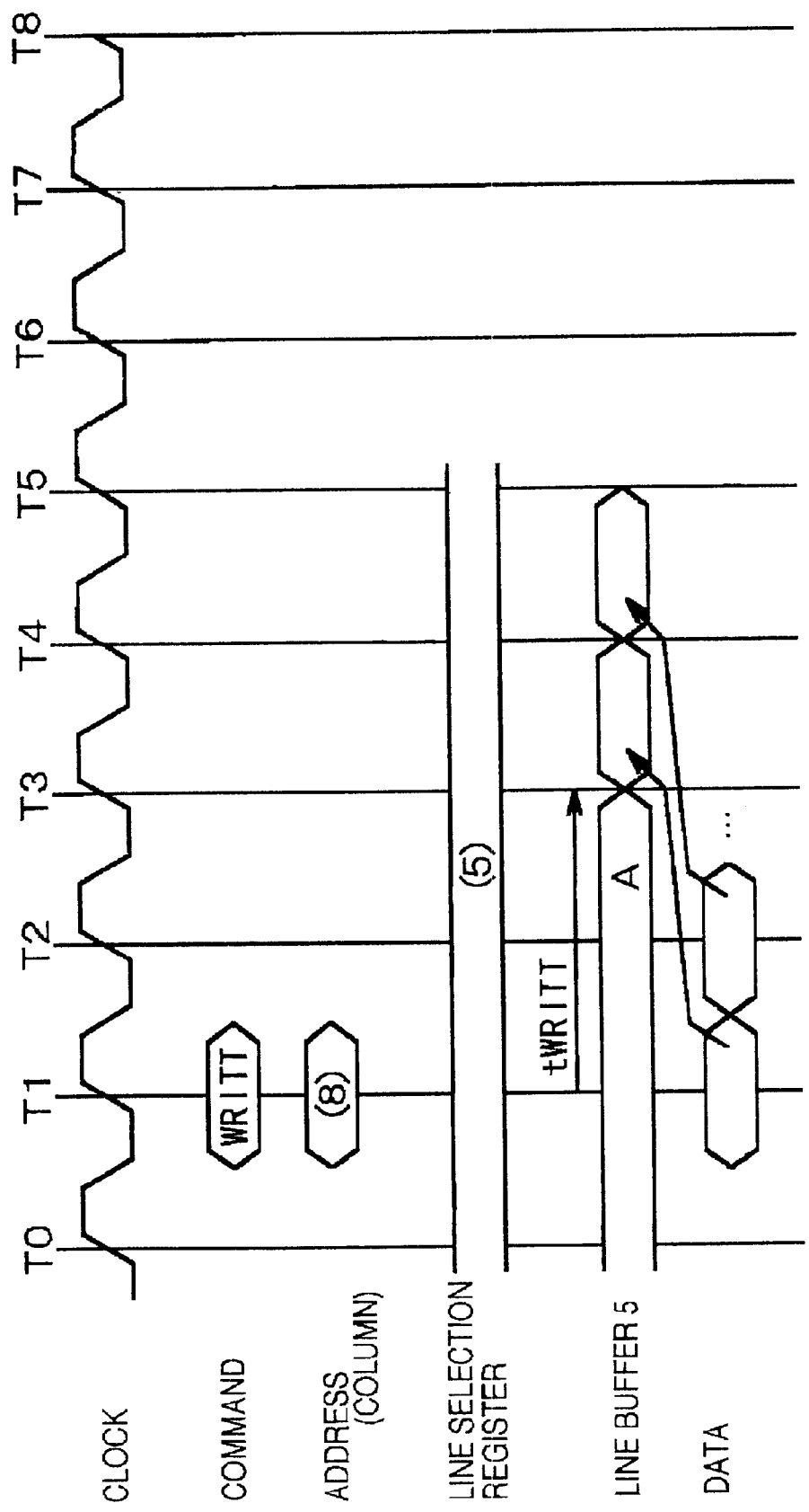
FIG. 9 is a timing chart illustrating a further mode of the operation of the plural line buffer type memory LSI in accordance with the present invention.

FIG. 9 and FIG. 10 show a timing chart illustrating a further mode of the operation of the plural line buffer type memory LSI in accordance with the present invention and a further address allocation in the address input terminal group 1, respectively. Here, a data transfer for transferring the data from the data input/output terminal group 3 to the plural line buffer section 8 is shown (in the following, a command for executing this operation will be called an "WRITT"). A column address is composed of 9 bits, and the address input terminal group 1 is composed of 14 bits.

As shown in FIG. 9, at a time T1, the WRITT instruction is inputted together with the column address, and data to be written is inputted to the data input/output terminal group 3. The data inputted to the data input/output terminal group 3 is inputted through the data buffer 9 to the plural line buffer section 8. In the plural line buffer section 8, the data supplied from the data buffer 9 is written, after a fixed delay time (tREAD) from the time T1, into a position designated by the column address, in the line buffer 15 selected by the line buffer number held in the line selection register 16 at the time T1.

As shown in FIG. 10, the address inputted to the address input terminal group 1 does not need the line buffer number for selecting the line buffer 15. Therefore, it is possible to prevent the increase in the number of address input terminals, thereby to maintain the compatibility with the general purpose LSI.

FIG. 11 and FIG. 12 show a timing chart illustrating a sixth mode of the operation of the plural line buffer type memory LSI in accordance with the present invention and an address allocation in the address input terminal group 1, respectively. An operation for transferring the data from the sense amplifier part 12 in the memory section 7 through the plural line buffer section 8 to the data input/output terminal group 3 is shown (in the following, a command for executing this operation will be called an "PER"). Here, a bank address, a row address and a column address are composed of 1 bit, 13 bits and 9 bits, respectively, and the address input terminal group is composed of 14 bits.

As shown in FIG. 11, at a time T1, an ACT instruction (an instruction for activating a page) is inputted, so that a page in the memory section 7 designated by the bank address and the row address is activated within a predetermined period of time (tAPD). After the time of TAPD from the time T1, a PER instruction is inputted together with the bank address and the column address. With the PER instruction, a page or a portion of the page, selected in the memory section 7, is outputted to the plural line buffer section 8. In the plural line buffer section 8, on the other hand, the data transferred from the memory section 7 is written into the line buffer 15 selected by the line buffer number held in the line selection register 16. Succeedingly, the plural line buffer section 8 outputs the data or a portion of the data of the line buffer 15 selected by the line buffer number held in the line selection register 16, to the data buffer 9. The data buffer 9 outputs the word designated by the column address, to the data input/output terminal group 3, after a fixed delay time (tPFR) from the issue of the PER instruction.

As shown in FIG. 12, the address inputted to the address input terminal group 1 does not need the line buffer number for selecting the line buffer 15. Therefore, it is possible to prevent the increase in the number of address input terminals, thereby to maintain the compatibility with the general purpose LSI.

Figure 13:
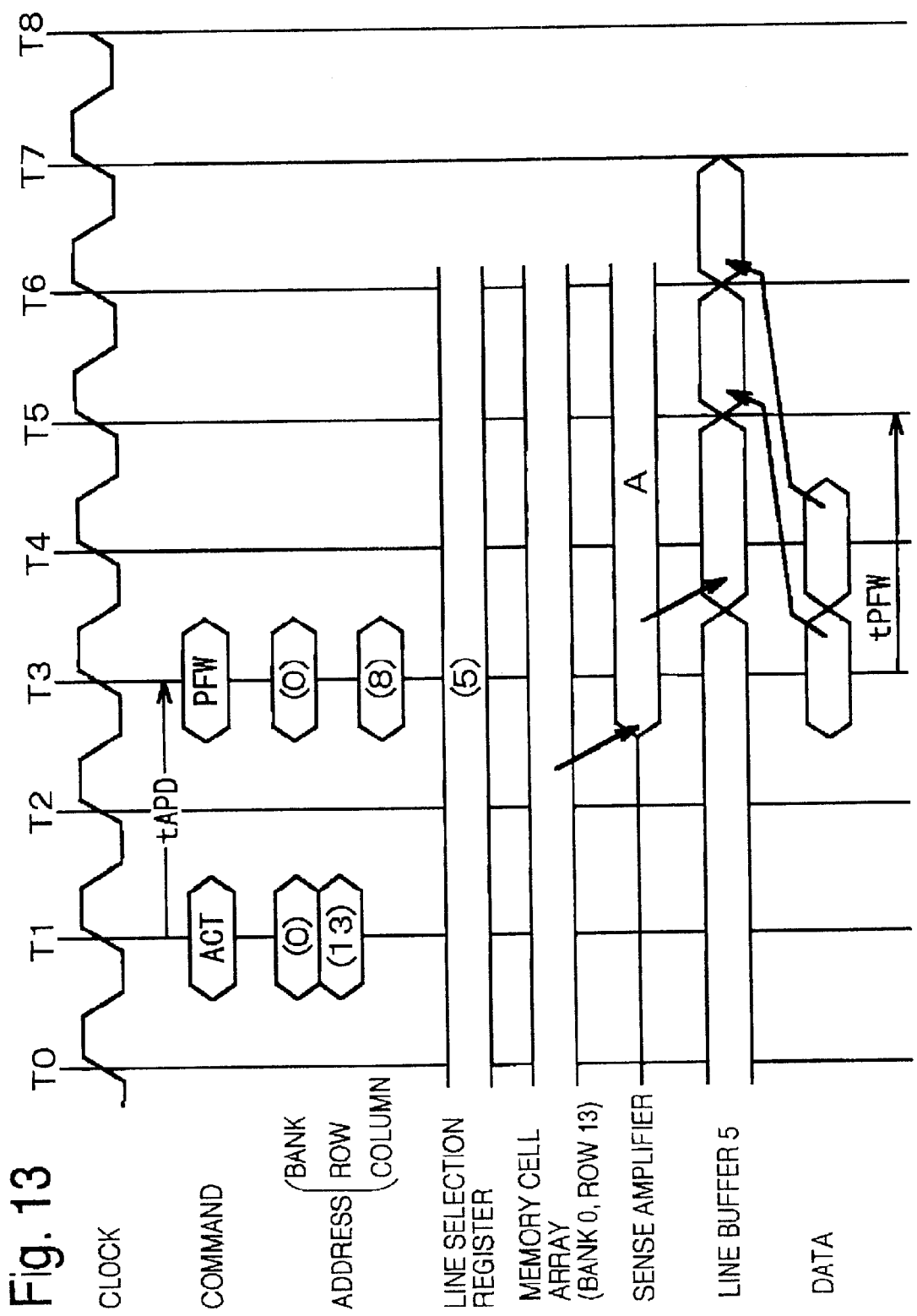
FIG. 13 is a timing chart illustrating a still further mode of the operation of the plural line buffer type memory LSI in accordance with the present invention.

FIG. 13 and FIG. 14 show a timing chart illustrating a still further mode of the operation of the plural line buffer type memory LSI in accordance with the present invention and a still further address allocation in the address input terminal group 1, respectively. An operation for transferring the data from the sense amplifier part 12 in the memory section 7 to the plural line buffer section 8 and succeedingly writing the data inputted to the data input/output terminal group 3 to the plural line buffer section 8 is shown (in the following, a command for executing this operation will be called an "PFW"). Here, a bank address, a row address and a column address are composed of 1 bit, 13 bits and 9 bits, respectively, and the address input terminal group is composed of 14 bits.

As shown in FIG. 13, at a time T1, the ACT instruction (the instruction for activating a page) is inputted, and a page in the memory section 7 designated by the bank address and the row address is activated within a predetermined period of time (tAPD). After the time of tAPD from the time T1, a PFW instruction is inputted together with the bank address and the column address. With the PFW instruction, a page or a portion of the page, selected in the memory section 7, is outputted to the plural line buffer section 8. In the plural line buffer section 8, on the other hand, the data transferred from the memory section 7 is written into the line buffer 15 selected by the line buffer number held in the line selection register 16. Succeedingly, in the plural line buffer section 8, a word data supplied from the data buffer 9 is written into a position designated by the column address, in the line buffer 15 selected by the line buffer number held in the line selection register 16.

As shown in FIG. 14, the address inputted to the address input terminal group 1 does not need the line buffer number for selecting the line buffer 15. Therefore, it is possible to prevent the increase in the number of address input terminals, thereby to maintain the compatibility with the general purpose LSI.

Figure 15:
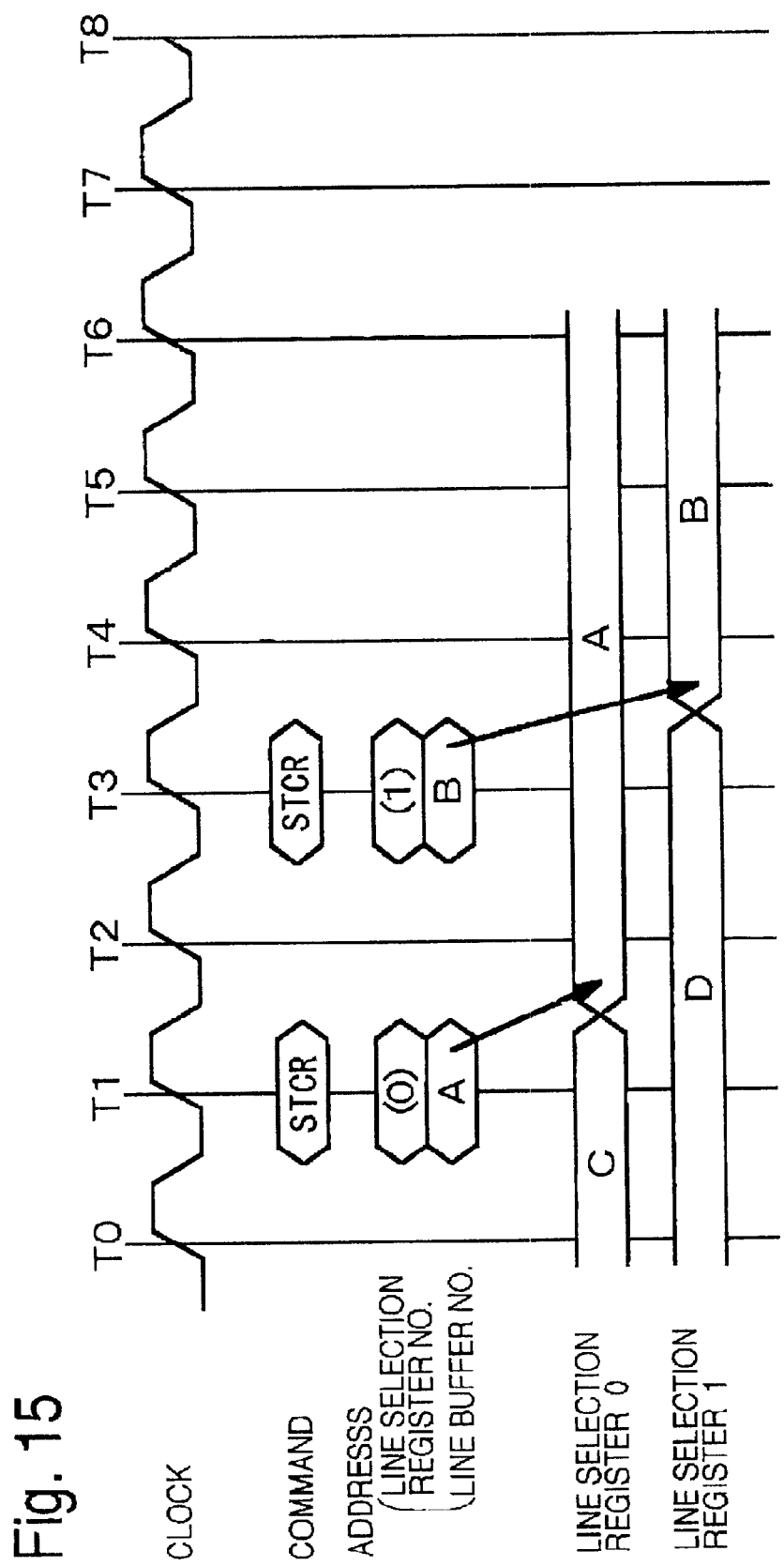
FIG. 15 is a timing chart illustrating a still further mode of the operation of the plural line buffer type memory LSI in accordance with the present invention.

FIG. 15 and FIG. 16 show a timing chart illustrating a still further mode of the operation of the plural line buffer type memory LSI in accordance with the present invention and a still further address allocation in the address input terminal group 1, respectively. Here, an operation for updating the value of the line selection register 16 is shown (in the following, a command for executing this operation will be called an "STCR"). A line selection register number (an address for selecting one of the plurality of line selection registers 16) and a line buffer number are composed of 2 bits and 4 bits, respectively, and the address input terminal group is composed of 14 bits.

At the time T1, a STCR instruction is inputted together with the line selection register number and the line buffer number. During a predetermined period of time (tSTCR) from the time T1, the value of the line selection register 16 designated by the line selection register number is updated to the line buffer number thus inputted. With this operation, the content of the line selection register 16 can be updated to an arbitrary value at an arbitrary timing.

FIG. 17 and FIG. 18 show a timing chart illustrating a still further mode of the operation of the plural line buffer type memory LSI in accordance with the present invention and a still further address allocation in the address input terminal group 1, respectively. Here, an operation for updating the value of the line selection register 16 is shown A line buffer number is composed of 4 bits, and the address input terminal group is composed of 14 bits.

At the time T1, a READT instruction is inputted together with the column address. With this operation, the data of the line buffer 15 designated by the line selection register 16 is transferred to the data buffer, and the word (A[10]) designated by the column address is outputted from the data buffer 9 to the data input/output terminal group 3.

In addition, at the time T1, the line buffer number for updating the line selection register after the reading operation is inputted through the address input terminals that are not used in the reading operation. After the reading operation, the value of the line selection register is updated to the inputted line buffer number. Therefore, in a next instruction (here, READT), the line buffer designated by the updated line buffer number is used.

As shown in FIG. 17, by previously inputting the line buffer number used in the next memory access, to the address input terminals or the command input terminals which are not used in the memory access instruction, it is possible to prevent the increase of the memory access delay, which occurred because the inputting of the line buffer number was limited to the inputting of the commands.

Since the plural line buffer type memory LSI in accordance with the present invention is added with the line selection register, it is not necessary to designate the line buffer number in an instruction for a data transfer operation between the memory section and the plural line buffer section. Therefore, it is possible to maintain the compatibility with the input/output terminals of a general purpose memory LSI (memory LSI having no line buffer), or to alternatively to prevent the increase in the number of input/output terminals and also to prevent the increase of the memory access delay attributable to the restriction in connection with the issue of the commands.

Furthermore, by previously inputting the line buffer number used in the next memory access, to the address input terminals or the command input terminals which are not used in the memory access instruction, the plural line buffer type memory LSI in accordance with the present invention can prevent the increase of the memory access delay, which occurred because the inputting of the line buffer number was limited to the inputting of the commands.

Moreover, the plural line buffer type memory LSI in accordance with the present invention can prefetch a portion of the data stored in the memory section to the plural line buffer section (namely, previously reads out the data), and on the other hand, the plural line buffer section can be accessed at a speed higher than that for accessing the memory section. Therefore, the plural line buffer type memory LSI can effectively reduce the delay time in the memory access in comparison with the general purpose memory LSI.

In addition, in the plural line buffer type memory LSI in accordance with the present invention, the line buffer number is designated by the line selection register before a memory access instruction is inputted. Accordingly, since it is possible to previously decode the line buffer number (to previously designate the line buffer), the line buffer can be accessed with a high speed in comparison with the conventional plural line buffer type memory LSI.

What is claimed is:

1. A plural line buffer type memory LSI comprising:
   a memory section;
   a plural line buffer section including a plurality of line buffers connected to said memory section; and
   a data buffer connected to said plural line buffer section,
   so that a data transfer is carried out between said memory section and said plural line buffer section and between said plural line buffer section and said data buffer,
   the plural line buffer type memory LSI further comprising a line selection register for designating at least one line buffer in said plural line buffer section.

2. A plural line buffer type memory LSI claimed in claim 1, wherein a data transfer is carried out between said memory section and the line buffer designated by said line selection register.

3. A plural line buffer type memory LSI claimed in claim 1, further including a data input/output terminal group connected to said data buffer, and wherein a data transfer is carried out between said data input/output terminal group and the line buffer designated by said line selection register.

4. A plural line buffer type memory LSI claimed in claim 1, wherein when data is read out from said memory section previously activated, to said data input/output terminal group, said data is written to the line buffer designated by said line selection register.

5. A plural line buffer type memory LSI claimed in claim 1, further including a command input terminal group and an address input terminal group, and wherein through said command input terminal group and said address input terminal group, a bank address and a row address are inputted to said memory section, and an operation instruction is given for writing a page or a portion of the page in said memory section designated by said bank address and said row address, to the line buffer designated by said line selection register.

6. A plural line buffer type memory LSI claimed in claim 5, wherein through said command input terminal group and said address input terminal group, a bank address and a row address are inputted to said memory section, and an operation instruction is given for writing data in the line buffer designated by said line selection register, to a page or a portion of the page in said memory section designated by said bank address and said row address.

7. A plural line buffer type memory LSI claimed in claim 5, wherein through said command input terminal group and said address input terminal group, a column address is inputted and an operation instruction is given for outputting a word designated by said column address, in data held in the line buffer designated by said line selection register, to said data input/output terminal group.

8. A plural line buffer type memory LSI claimed in claim 5, wherein through said command input terminal group and said address input terminal group, a column address is inputted and an operation instruction is given for writing data inputted from said data input/output terminal group, to a word designated by said column address, in the line buffer designated by said line selection register.

9. A plural line buffer type memory LSI claimed in claim 5, wherein through said command input terminal group and said address input terminal group, a bank address and a column address are inputted, and the following operation instructions are given:
   an operation instruction for writing a page or a portion of the page in said memory section designated and pre-activated by said bank address, to the line buffer designated by said line selection register; and then,
   an operation instruction for outputting a word designated by said column address, in the data held in the line buffer designated by said line selection register, to said data input/output terminal group.

10. A plural line buffer type memory LSI claimed in claim 5, wherein through said command input terminal group and said address input terminal group, a bank address and a column address are inputted, and the following operation instructions are given:
    an operation instruction for writing a page or a portion of the page in said memory section designated and pre-activated by said bank address, to the line buffer designated by said line selection register; and then,
    an operation instruction for writing data inputted from said data input/output terminal group, to a word designated by said column address, in the data held in the line buffer designated by said line selection register.

11. A plural line buffer type memory LSI claimed in claim 10, wherein after completion of the operation of said instruction given, but prior to a next memory access operation, a pre-charging of said memory section is automatically executed.

12. A plural line buffer type memory LSI claimed in claim 11, wherein a portion of the command or the address in the memory access instruction is added with the number for designating one of a plurality of line selection registers, and by using the line buffer designated by the line selection register designated by said number, tie data transfer is carried out between said memory section and said plural line buffer section and between said plural line buffer section and said data input/output terminal group.

13. A plural line buffer type memory LSI claimed in claim 11, wherein by using a portion of the command or the address in the memory access instruction, said line selection register is designated and the value to be written into the designated line selection register is designated, and after the memory access instruction is executed, the designated line selection register is updated.

14. A plural line buffer type memory LSI claimed in claim 11, further including a control circuit, said control circuit giving an operation instruction for designating one of said line selection registers and changing the designated line selection register.

* * * * *

UNITED STATES PATENT AND TRADEMARK OFFICE
CERTIFICATE OF CORRECTION

Figure 19:
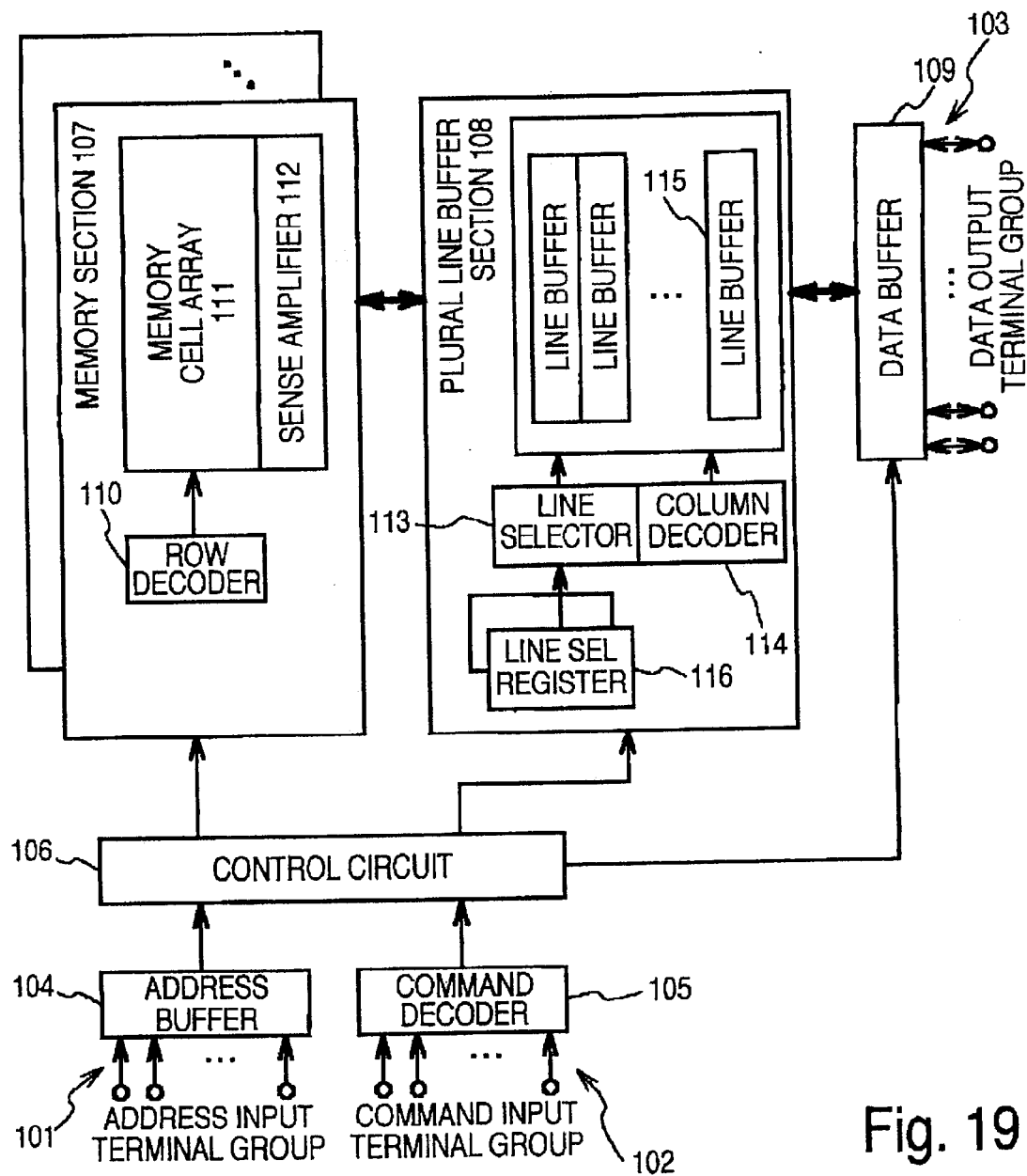
FIG. 19 is a circuit block diagram illustrating a conventional plural line buffer type memory LSI.
Figures 20, 21:
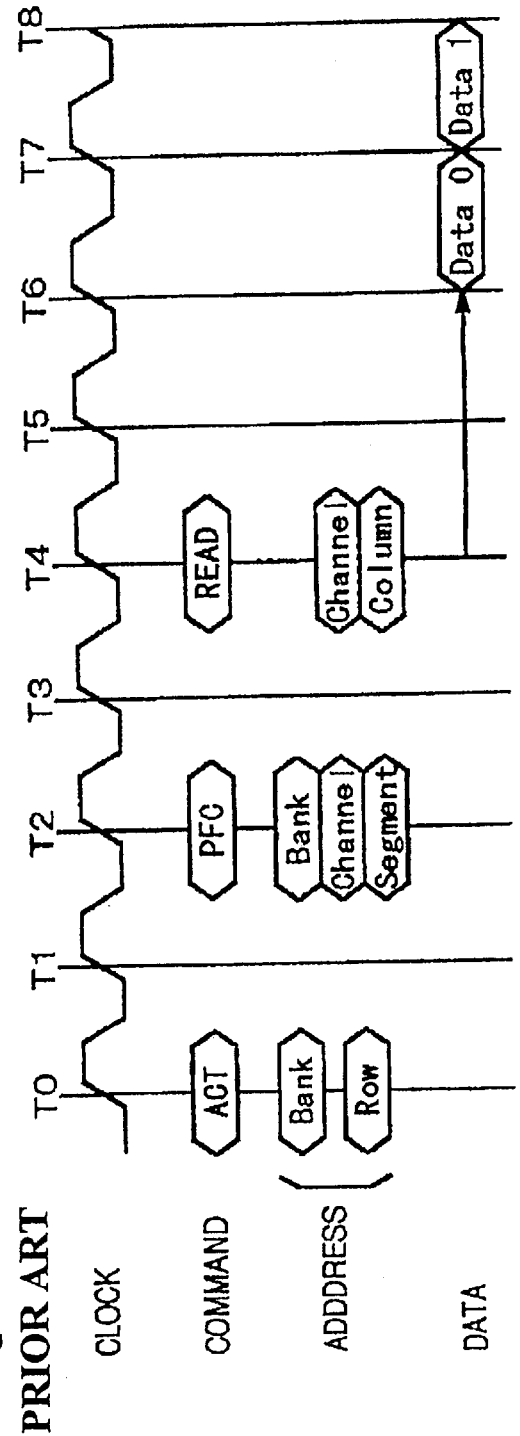
FIG. 20 is an address table showing an address of the conventional plural line buffer type memory LSI.
FIG. 21 is a timing chart illustrating an operation of the conventional plural line buffer type memory LSI.
Figure 19:
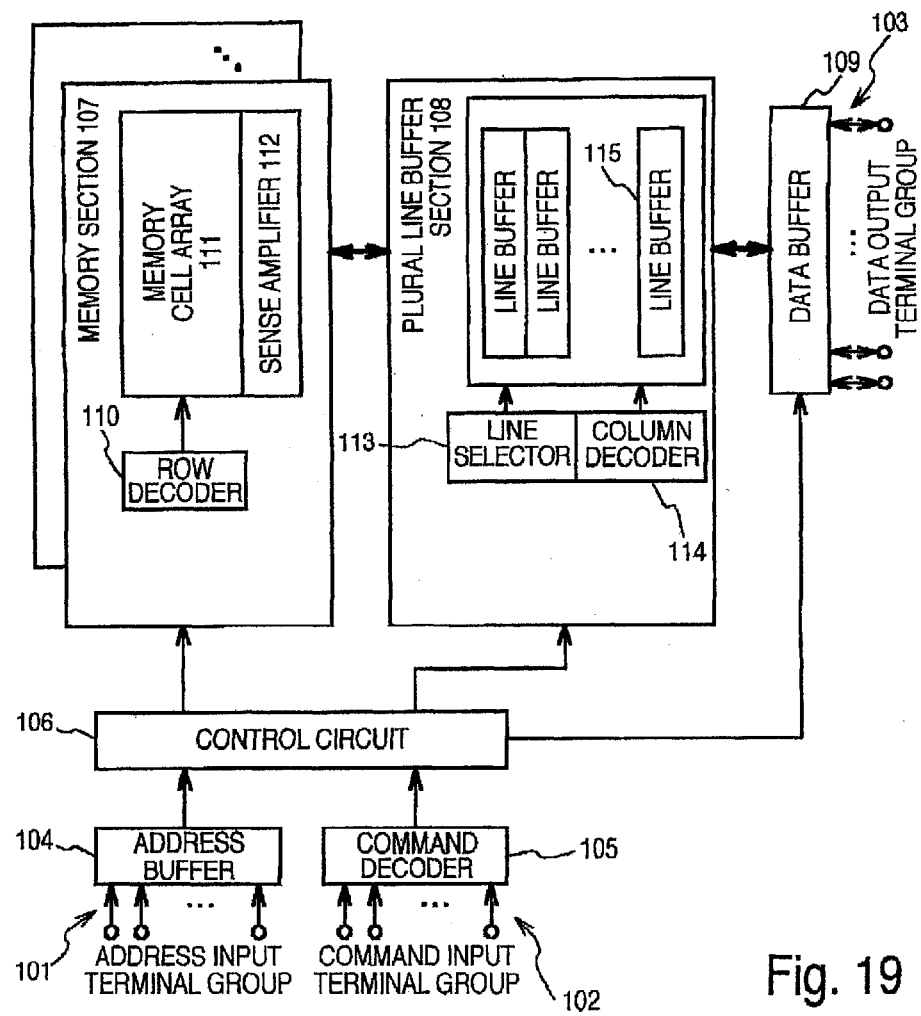

PATENT NO. : 6,556,484 B2
DATED : April 29, 2003
INVENTOR(S) : Yoshikazu Yabe and Masato Motomura It is certified that error appears in the above-identified patent and that said Letters Patent is hereby corrected as shown below:

<u>Drawings,</u>
Delete the Drawing sheet 12 of 13 and substitute therefor the drawing sheet consisting of Fig. 19 as shown on the attached page.

Signed and Sealed this

Sixteenth Day of September, 2003

JAMES E. ROGAN
*Director of the United States Patent and Trademark Office*